United States Patent [19]
Lee et al.

[11] Patent Number: 5,924,190
[45] Date of Patent: Jul. 20, 1999

[54] METHODS AND APPARATUS FOR MANUFACTURING ENCAPSULATED INTEGRATED CIRCUITS

[75] Inventors: Sang S. Lee, Sunnyvale; Che-Yuan Chen, San Jose, both of Calif.

[73] Assignee: VLSI Technology, Inc., San Jose, Calif.

[21] Appl. No.: 09/054,829

[22] Filed: Apr. 3, 1998

Related U.S. Application Data

[62] Division of application No. 08/569,772, Dec. 8, 1995, Pat. No. 5,825,623.

[51] Int. Cl.$^6$ .................................................. H02R 43/00
[52] U.S. Cl. ........................... 29/827; 257/675; 257/707; 257/796; 438/118; 438/122
[58] Field of Search ............................. 29/827, 825, 846, 29/830; 257/707, 675, 796; 438/118, 122

[56] References Cited

U.S. PATENT DOCUMENTS

| | | |
|---|---|---|
| 4,891,333 | 1/1990 | Baba et al. ................................ 29/827 |
| 4,975,761 | 12/1990 | Chu . | |
| 5,159,750 | 11/1992 | Dutta et al. ................................ 29/827 |
| 5,188,985 | 2/1993 | Medeiros et al. ...................... 29/846 X |
| 5,202,288 | 4/1993 | Doering et al. .......................... 29/827 |
| 5,210,598 | 5/1993 | Nakazaki et al. ........................ 257/530 |
| 5,331,511 | 7/1994 | Lee et al. ................................ 361/713 |
| 5,493,146 | 2/1996 | Pramanik et al. ...................... 257/530 |
| 5,502,315 | 3/1996 | Chua et al. .............................. 257/50 |
| 5,529,959 | 6/1996 | Yamanaka .............................. 29/827 X |
| 5,646,828 | 7/1997 | Degani et al. . | |
| 5,686,361 | 11/1997 | Ootsuki ................................ 29/827 X |
| 5,701,034 | 12/1997 | Marrs . | |

*Primary Examiner*—Carl J. Arbes
*Attorney, Agent, or Firm*—Martine Penilla & Kim, LLP

[57] ABSTRACT

Methods and apparatuses for encapsulating thermally enhanced (TE) and electrically and thermally enhanced (ETE) integrated circuit assemblies that include bulky thermally conductive heat sinks so as to prevent the formation of pinholes and IC warpage without adding bulk or additional structures. The assemblies are repositioned, through offset in the bonding fingers of the leadframe, so that the rates of mold flow in the two halves of the mold cavity are substantially balanced. The repositioning of the assemblies also substantially balances the amount of mold material in the mold halves to prevent warpage when the IC cools down.

8 Claims, 7 Drawing Sheets

METHODS AND APPARATUS FOR MANUFACTURING ENCAPSULATED INTEGRATED CIRCUITS

This is a Divisional application of prior application Ser. No. 08/569,772 filed on Dec. 8, 1995, now U.S. Pat. No. 5,825,623, the disclosure of which is incorporated herein by reference.

BACKGROUND OF THE INVENTION

The present invention relates to integrated circuits. More particularly, the present invention relates to novel and cost-effective methods of encapsulating integrated circuit (IC) assemblies that are either thermally or electrically and thermally enhanced.

Encapsulated integrated circuits are known. In an encapsulated integrated circuit, the integrated circuit die is encapsulated in a mold compound, e.g., plastic, accessible through pins external to the molded plastic body. The pins themselves are typically part of a conventional leadframe, which are electrically bonded to bonding pads on the die prior to encapsulation.

As is well known, the integrated circuit die generates an appreciable amount of heat during operation. If the generated heat is not adequately vented and an excessive amount of heat is retained, heat-related damages to the integrated circuit may occur over time. To remove heat from an integrated circuit die, it is customary to thermally enhance the performance of the finished IC by attaching the die to a thermally conductive heat sink formed of, for example, copper, ceramic, or other suitable thermally conductive materials.

FIG. 1 illustrates an integrated circuit assembly of a conventional thermally-enhanced (TE) integrated circuits. The IC assembly of FIG. 1 is said to be thermally enhanced because its die is attached to a heat sink to effectuate heat removal. Referring now to FIG. 1, an integrated circuit die 10 is electrically insulated from and attached to the top side of a thermally conductive heat sink 12, which is shown to be relative bulky to facilitate efficient heat transfer. Thermally conductive heat sink 12 is preferably dimensioned so that its bottom end is exposed to the ambient environment after encapsulation to facilitate efficient heat removal from the IC die.

Bonding fingers 14 of a conventional leadframe 16 are also electrically insulated from and attached to the outer margins of thermally conductive heat sink 12 at its top side. Bonding wires 18 couple individual ones of bonding fingers 14 to bonding pads disposed at the top side of die 10 to form conduction paths to and from die 10.

As in the case of a conventional quad flat package (QFP), the bulky thermally conductive heat sink 12, its attached die 10, and bonding wires 18 are encapsulated in a mold cavity formed between the two cavity halves 20 and 22 of mold 24. Pressured molten mold material formed of, for example, thermally set plastic, is injected into the two mold cavity halves, usually at a corner of mold 24 via a port or a gate that is either coplanar with leadframe 16, in a top cavity half 20 as shown in FIG. 1, or in lower cavity half 22 (not shown). In FIG. 1, the pressured molten mold material enters the top cavity half 20 of the mold and flows over the top surface of the die, through the spaces between the bonding fingers 14 of leadframe 16 into the bottom cavity half 22 of the mold cavity. In the bottom cavity half, some of the molten mold material flows around heat sink 12 to substantially fill up bottom cavity half 22. Any gas that was present within the mold cavity is ideally expelled through air vents, of which vents 26 and 27 are exemplary. Preferably, there are air vents in both upper cavity half 20 and lower cavity half 22 as shown in FIG. 1.

With reference to FIG. 1, the arrows indicate the flow of mold material through the top cavity half and bottom cavity half of mold 24. Ideally, the molten mold material should fill up the top and bottom cavity halves of mold 24 substantially simultaneously to avoid plugging up vent 26 and trap air inside the cavity halves. This is because the trapped air creates voids, or pinholes, in the body of the finished IC.

However, the presence of heat sink 12 unbalances the flow of molten mold material by reducing the flow cross-section area in lower cavity half 22. Since the flow of mold material in upper cavity half 20 is relatively unimpeded, this causes the molten mold material in the upper cavity half of the mold to reach air vent 26 first, thereby essentially "plugging-up" the air vent. Any gas remaining in the bottom cavity half of the mold is then trapped, unable to exhaust through vent 26. As stated, this trapped air becomes pinholes, also known as blow holes or voids, in the body of the finished IC. A typical pinhole 28 is shown in FIG. 1.

The presence of pinhole 28 represents a defect in the finished IC and is often the cause for rejecting it. This is because pinhole 28 may allow ambient moisture and contaminants to reach die 10 and/or bonding fingers 14, possibly shorting out the circuitries and/or corroding the electrical contacts.

The presence of heat sink 12 also unbalances the amount of molten mold material in the two cavity halves, with the top cavity half having substantially more mold material than the bottom cavity half. As is known, molten mold materials experience shrinkage when they cool. As a consequence, the top half of the finished IC, having more mold material, tends to shrink more than the bottom half. The finished IC may warp, leading to mechanical stress and failure.

The above mentioned pinhole formation and warpage problems also affect other types of IC's as well. To facilitate discussion, FIG. 2A shows a prior art and known electrically and thermally enhanced (ETE) IC assembly, typically packaged in a quad flat pack (ETEQFP). A die 50 of ETE assembly 52 is attached to the top surface of a thermally conductive heat sink 54 using an electrically conductive adhesive such as silver epoxy or other similarly suitable adhesives. Thermally conductive heat sink 54 is preferably dimensioned so that its bottom end is exposed to the ambient environment after encapsulation to facilitate efficient heat removal from the IC die.

Die 50 is disposed in an annular opening of a wafer board 56, with the outer edges of the upper surface of heat sink 54 attached to and preferably insulated from the underside of wafer board 56. To improve mechanical integrity, wafer board 56 may optionally include a groove 58 into which heat sink 54 partially protrudes (as shown in FIG. 2A).

Bonding pads 62 at the top surface of die 50 electrically couple the die circuitries with wires 64, which are in turn electrically coupled to conducting leads running along top surface 60 of wafer board 56. These conducting leads are in turn electrically coupled to inwardly-extending fingers 66 of a leadframe 68. In the ETE assembly of FIG. 2A, heat sink 54 and wafer board 56 enhance the performance of the finished IC both thermally and electrically.

To discuss the electrical enhancements provided by the wafer board, FIG. 2B shows a cross-section view of a representative wafer board, such as wafer board 56 of FIG. 2A. For simplicity of illustration, wafer board 56 of FIG. 2B is shown without optional groove 58, whose function is, as mentioned earlier, primarily mechanical. Wafer board 56 preferably comprises a multilayer board, having alternating layers of a ground plane 70, a Vdd plane 72, a ground I/O plane 74, a Vdd I/0 plane 76, and a signal plane 78 sandwiched between insulating layers 80, 82, 84, and 86. Vias 88 and 90 electrically couple ground I/O plane 74 with ground plane 70 and Vdd I/O plane 76 with Vdd plane 72. The sandwich arrangement, as will be realized by those familiar in the high frequency design art, maximizes capacitance to improve the high frequency performance of the resulting IC.

Signal plane 78 resides at the top surface of wafer board 56 and comprises a plurality of conducting leads radiating outwardly from the die end, i.e. left to right in FIG. 2B. The conducting leads are electrically coupled at their outer, i.e., right, ends with inwardly-extending fingers 66 of leadframe 68. The conducting leads are further electrically coupled at their inner, i.e., left, ends with bonding pads on the top surface of die 10 using wires 64 (shown in FIG. 1).

Some of the wires 64 are also used to couple die bonding pads to ground I/O plane 74 and Vdd I/O plane 76. A solder mask structure 77 is provided to keep these two planes from being shorted together by wires 64. Within ground I/O plane 76, conductors are strategically placed, e.g., a ground I/O conductor under every five conducting leads, so as to minimize the inductance and the concomitant crosstalk experienced by the conducting leads in signal plane 78.

As it stands, the ETEQFP of FIG. 2A represents a low-cost and highly efficient structure for attaching a high performance IC die to a leadframe while maximizing high electrical and thermal performance. When the ETEQFP of FIG. 2A is placed in a mold for encapsulation, however, it is discovered the above-discussed pinhole and warpage problems may sometimes occur. This is because both wafer board 56 and thermally conductive heat sink 54 are disposed on one side of the leadframe. In other words, when leadframe 68 is clamped between two halves of a mold, e.g., mold 24 of FIG. 1, the cavity half in which wafer board 56 and heat sink 54 are positioned present a reduced flow cross-section to the injected molten mold material, thereby reducing its flow rate relative to that in the other cavity half. As illustrated in FIG. 3, the imbalance in the flow of the molten mold material (shown by the arrows) plugs the exhaust vent, traps air in the lower cavity half and results in pinholes, of which pinhole 102 is exemplary.

Further, the fact that both the wafer board and the heat sink are positioned in one mold cavity half means that less molten mold material is present in that mold cavity half relative to the other mold cavity half. When the molten mold material cools, the side of the finished IC with less mold material, i.e., the heat sink side, tends to shrink less, resulting in warpage of the finished IC product as illustrated in FIG. 4.

In view of the foregoing, what is desired is improved methods and apparatuses for encapsulating thermally enhanced (TE) and electrically and thermally enhanced (ETE) integrated circuit assemblies that include bulky thermally conductive heat sinks so as to prevent the formation of pinholes and IC warpage.

SUMMARY OF THE INVENTION

The present relates, in one embodiment, to a method for manufacturing an integrated circuit assembly that has a die, a thermally conductive heat sink coupled to a first side of the die, a multi-layer wafer board having wafer board bonding pads electrically coupling to die bonding pads on a second side of the die opposite the first side. The method includes the step of providing a conductive lead frame having a plurality of inwardly-extending fingers that are offset from the conductive lead frame. The offset is such that inward ends of the inwardly extending fingers form a first plane parallel to and separated from a second plane, which represents a plane formed by the conductive lead frame, by an offset distance.

The method further includes the step of electrically coupling the plurality of inwardly extending fingers with the wafer board bonding pads. In accordance with this embodiment, the coupling step is performed while positioning the multi-layer wafer board relative to the conductive lead frame such that when the integrated circuit assembly is placed in a mold having an exhaust vent for encapsulation with a mold compound and the conductive lead frame is clamped between a first cavity half and a second cavity half of the mold, a first portion of the multi-layer wafer board protrudes into the first cavity half of the mold while the thermally conductive heat sink at least partially protrudes into the second half of the mold. The first portion of the multi-layer wafer board, when the multi-layer wafer board is so positioned relative to the conductive lead frame, is of a size that impedes a flow of the mold compound in the first cavity half to a flow-balancing rate. This flow-balancing rate permits the the flow of the mold compound in the first cavity half and the second cavity half to arrive at the exhaust vent substantially simultaneously, thereby substantially reducing a likelihood of pinhole formation in the mold.

In another embodiment, the invention relates to a method for manufacturing an integrated circuit assembly that has a die, a thermally conductive heat sink having a first heat sink surface coupled to a first side of the die. The method includes the step of providing a conductive lead frame having a plurality of inwardly-extending fingers that are offset from the lead frame such that inward ends of the inwardly extending fingers form a first plane parallel to and separated from a second plane, representing a plane formed by the conductive lead frame, by an offset distance.

In this embodiment, the method further includes the step of attaching, in an electrically insulated manner, the plurality of inwardly extending fingers to outer periphery of the thermally conductive heat sink at the first heat sink surface. The attachment is performed while positioning the thermally conductive heat sink relative to the conductive lead frame such that when the integrated circuit assembly is placed in a mold having an exhaust vent for encapsulation with a mold compound and the conductive lead frame is clamped between a first cavity half and a second cavity half of the mold, a first portion of the thermally conductive heat sink protrudes into the first cavity half of the mold while the thermally conductive heat sink at least partially protrudes into the second half of the mold. The first portion of the thermally conductive heat sink, when the thermally conductive heat sink is so positioned relative to the conductive lead frame for encapsulation, is of a size that impedes a flow of the mold compound in the first cavity half to a flow-balancing rate. This flow-balancing rate permits the the flow of the mold compound in the first cavity half and the second cavity half to arrive at the exhaust vent substantially simultaneously to avoid trapping air in the mold. Additionally, there is also provided the step of electrically coupling the plurality of inwardly extending fingers with bonding pads disposed on a second side of the die opposite the first side.

These and other advantages of the present invention will become apparent upon reading the following detailed descriptions and studying the various figures of the drawings.

DETAILED DESCRIPTION OF THE PREFERRED EMBODIMENTS

Figure 1:
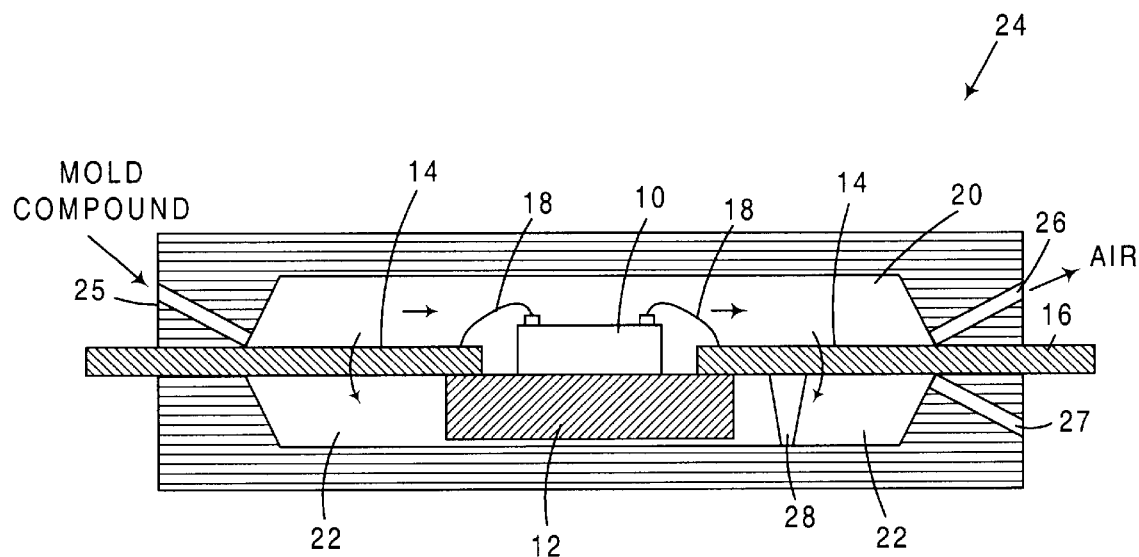
FIG. 1 illustrates an integrated circuit assembly of a thermally-enhanced (TE) integrated circuit to facilitate discussion of the pinhole formation and warpage problems.
Figure 2A:
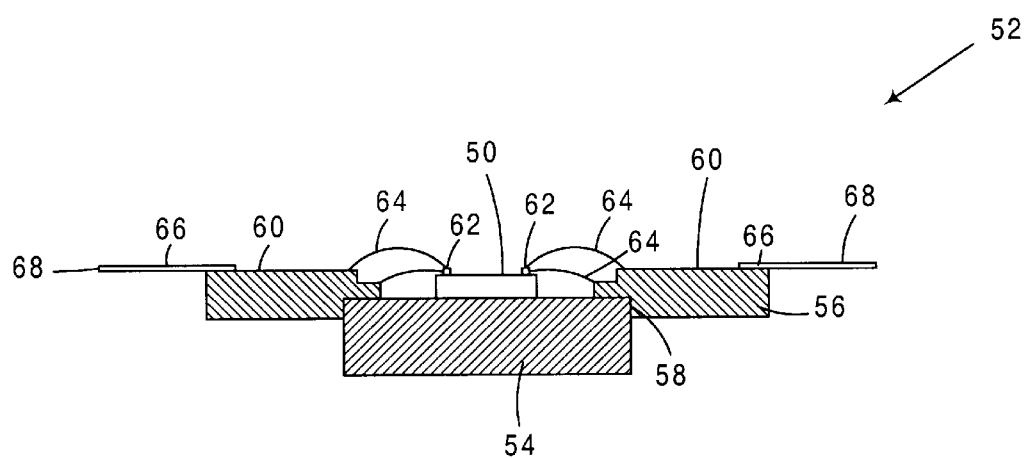
FIG. 2A illustrates a prior art and known electrically and thermally enhanced (ETE) IC assembly to facilitate further discussion of the pinhole formation and warpage problems.
Figure 2B:
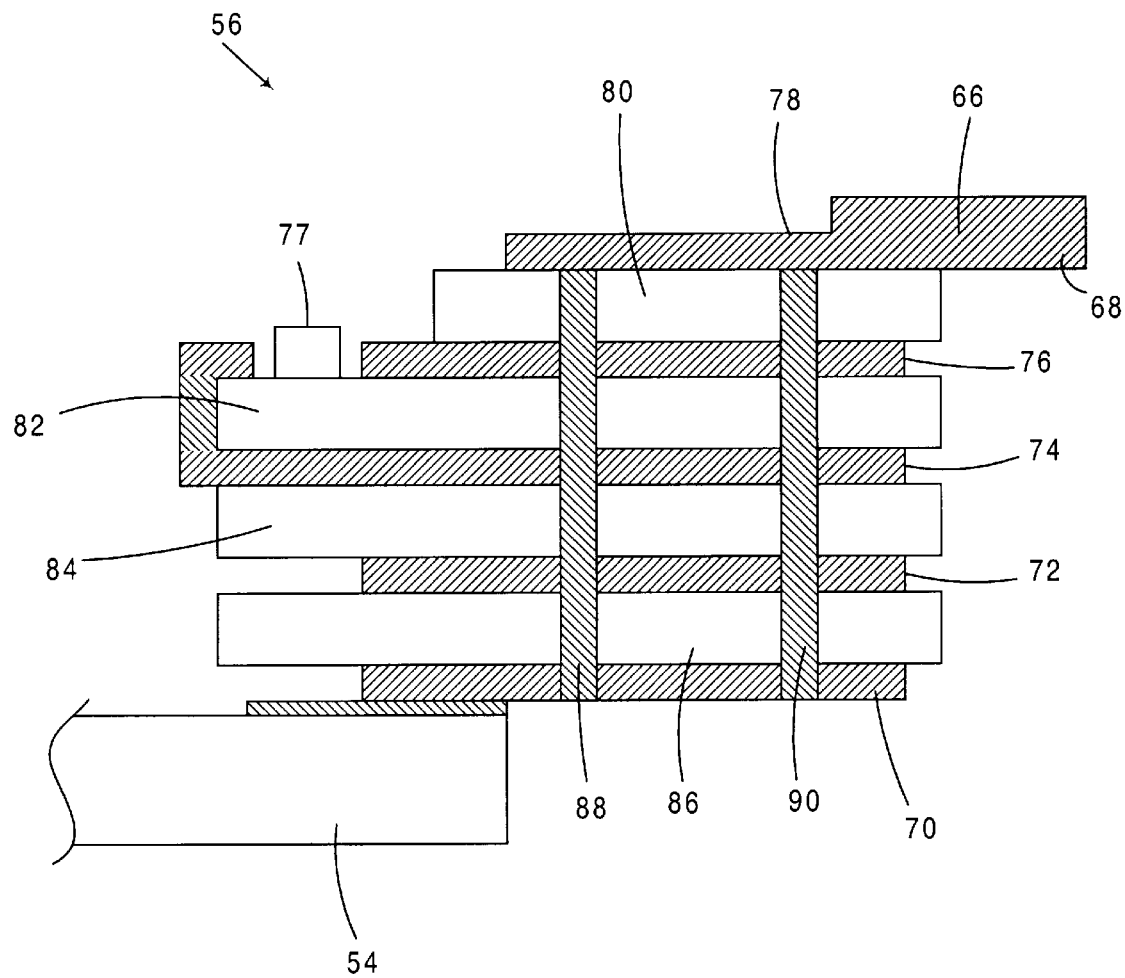
FIG. 2B shows a cross-section view of a wafer board of the electrically and thermally enhanced (ETE) IC assembly of FIG. 2A.
Figure 3:
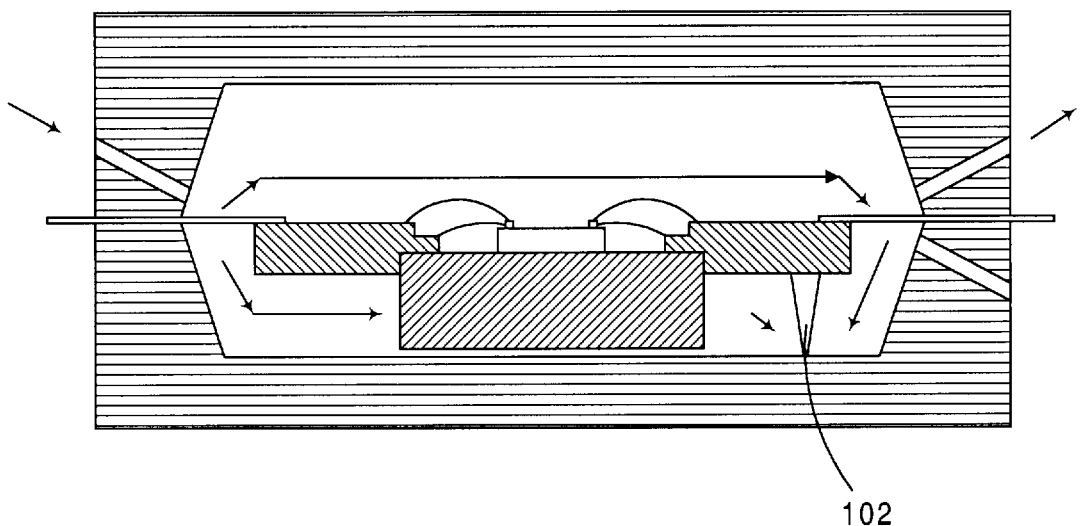
FIG. 3 shows the formation of a pinhole in the finished IC, which results from the imbalance in the flow of the molten mold material during encapsulation.
Figure 4:
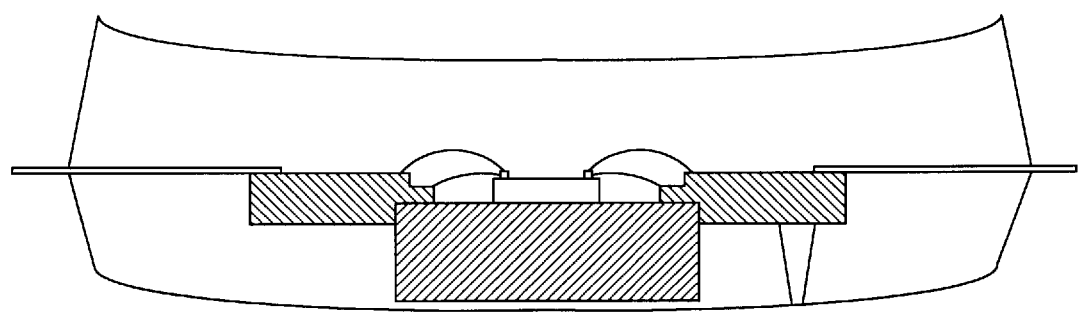
FIG. 4 shows a warped finished IC, illustrating the effect of having too much molten mold material on one side of the IC.

FIG. 1 illustrates an integrated circuit assembly of a thermally-enhanced (TE) integrated circuit to facilitate discussion of the pinhole formation and warpage problems. FIG. 2A illustrates a prior art and known electrically and thermally enhanced (ETE) IC assembly to facilitate further discussion of the pinhole formation and warpage problems. FIG. 2B shows a cross-section view of a wafer board of the electrically and thermally enhanced (ETE) IC assembly of FIG. 2A. FIG. 3 shows the formation of a pinhole in the finished IC, which results from the imbalance in the flow of the molten mold material during encapsulation. FIG. 4 shows a warped finished IC, illustrating the effect of having too much molten mold material on one side of the IC.

In one aspect of the present invention, there is provided a cost-effective and highly efficient technique for balancing the flow of the molten mold compound in the two cavity halves of a mold when ETE assemblies, such as those implemented in QFP packages, are encapsulated. Most advantageously, the inventive technique balances the mold flow without adding additional structures or bulk to the IC assembly.

Figure 5:
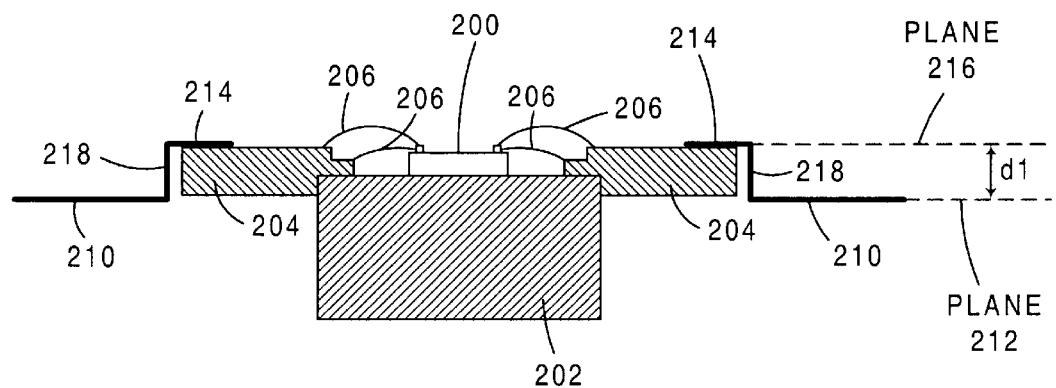
FIGS. 5, 6, and 7 show, in accordance with one embodiment of the present invention, an improved electrically and thermally enhanced (ETE) IC assembly that advantageously reduce pinhole formation and warpage.
Figure 6:
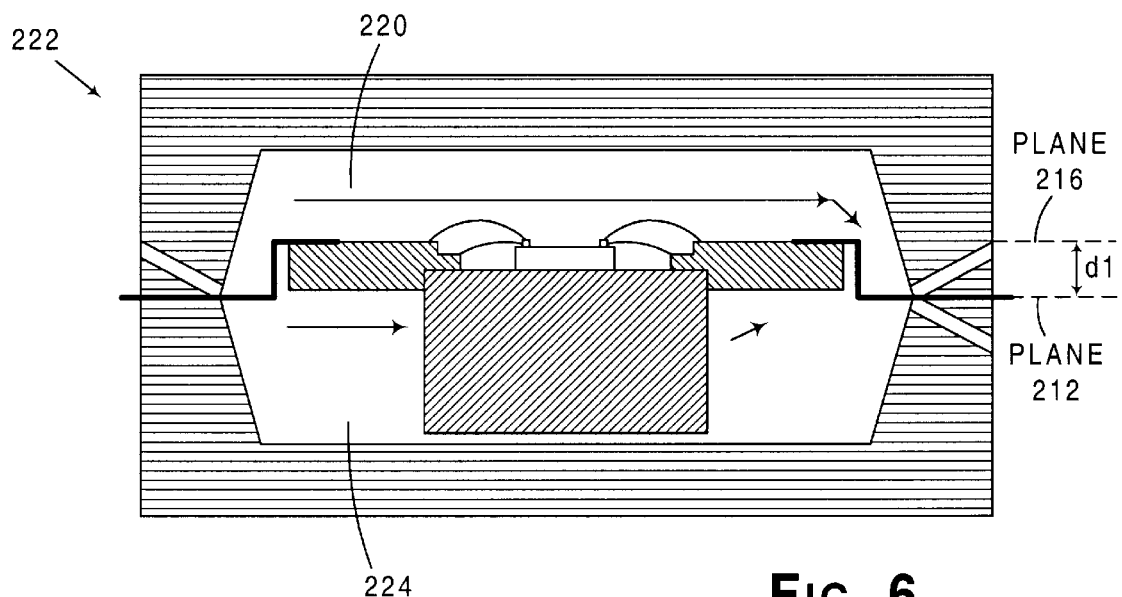

Referring now to FIGS. 5 and 6, there is shown an ETE IC assembly comprising IC die 200, thermally conductive heat sink 202, and wafer board 204, which is coupled to bonding pads on the upper surface of IC die 200 by conductive wires 206. The ETE assembly comprising IC die 200, thermally conductive heat sink 202, wafer board 204, and conducting wires 206 are arranged substantially as shown and discussed in FIG. 2. A leadframe 210, which defines a first plane 212 at its mold-contacting edges, is also shown. As the term is used herein, the mold-contacting edges of the leadframe refers to the leadframe edges that contact the encapsulation material and protrude therefrom after the IC assembly is encapsulated.

Near wafer board 204, inwardly-extending bonding fingers 214 of leadframe 210 are offset or bent to define an elevated plane 216 at its ends. Plane 216 is parallel to and elevated from plane 212 by a offset distance d1 as shown in FIG. 5. Bonding fingers 214 are electrically coupled to bonding pads, which are disposed at the top side of wafer board 204, at this plane 216.

Advantageously, each finger 214 of leadframe 210 includes an offset segment 218 which, when encapsulated in the mold material, substantially improves the lead pull strength of the finished IC product over the IC assemblies of FIGS. 1 and 2A. Note that although offset segment 218 makes a right angle with plane 212, such is not a requirement, and any angle may be suitable as long as the desired offset distance d1 is satisfactorily achieved.

Offset segment 218 elevates a portion of wafer board 204 into an upper cavity half 220 of a mold 222 and out of a lower cavity half 224 of mold 222. Because of this offset, at least a portion of wafer board 204 is positioned between planes 212 and 216, thereby reducing the flow cross section within upper mold cavity half 220. The flow rate of the molten mold compound in upper cavity half 220 is reduced to a flow-balancing rate, which allows mold-flow in the two cavity halves to be balanced. The mold flow is considered balanced when the mold flow in the upper cavity half and the mold flow in the lower cavity half are modulated such that one does not reach the exhaust air vent before the other to trap air in the mold. As mentioned earlier, when the mold flows in the two cavity halves are balanced, pinholes or voids are eliminated because the air exhaust vent is not plugged up by the fast mold flow to trap air within the mold cavities.

The balancing of the molten mold flows in the two mold cavity halves is accomplished by the invention without requiring additional bulk, structures or process steps. The present invention is therefore a substantial improvement over the prior art in which additional bulk is typically added to the IC assembly on the side without the bulky heat sink, e.g., the upper side of wafer board 204 of FIG. 5, to impede the flow rate of the faster flowing molten mold compound. This has several important implications. First, the absence of additional bulk or structures reduces the chance of introducing contamination into the delicate IC circuitry and reduces the complexity of the fabrication process. More importantly, the inventive technique results in a less bulky final product, thereby allowing the finished IC to be employed in applications where space is at a premium, e.g., modern electronic devices such as portable computers or other portable electronic devices.

As an additional advantage, the elevation of more of the assembly into the upper mold cavity half and out of the lower mold cavity half also balances out the amount of mold material in the mold cavity halves. Consequently, there is less warpage when the finished IC product cools down.

Figure 7:
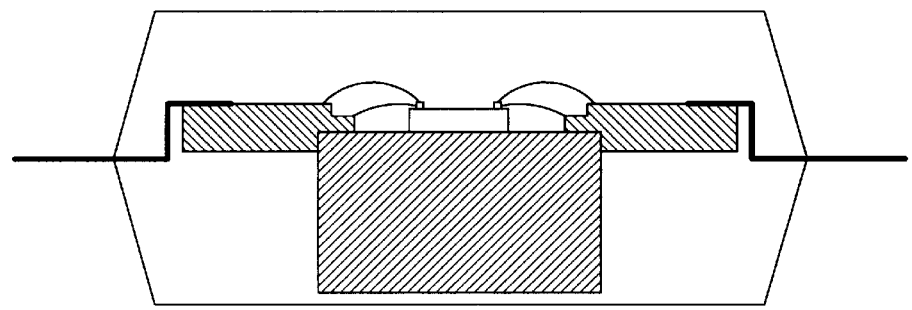

Most advantageously, the invention represents a highly cost-effective method of balancing mold flow and reducing warpage. The bonding fingers may be offset or bent by any number of conventional and relatively inexpensive metal processing techniques, including stamping. Without the addition of special flow-impeding bulk or structures and/or relatively costly additional IC processing steps, the overall impact on manufacturing costs is minimal. The finished IC product is shown in FIG. 7. Advantageously, there are no pinholes and very little, if any, warpage.

Figure 8:
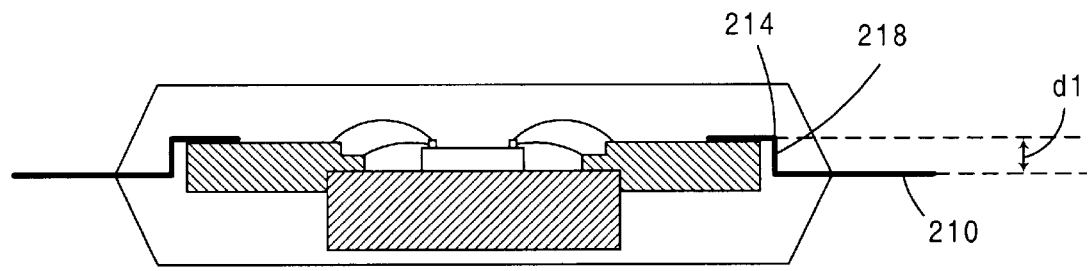
FIGS. 8 and 9 show alternative embodiments of the improved electrically and thermally enhanced (ETE) IC assembly of FIG. 5.
Figure 9:
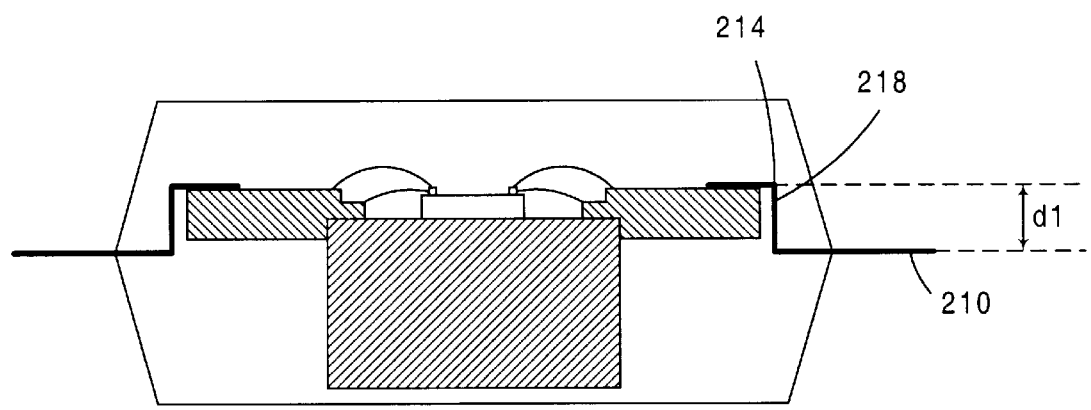

By appropriately positioning wafer board 204 relative to leadframe 210, the portion of wafer board 204 that protrudes into upper cavity half 220 and the portion of thermally conductive heat sink 202 that protrudes into lower cavity half 224 may be modulated to substantially balance the mold flows in the two cavity halves. In one embodiment, the height of offset segment 218 of bonding fingers 214 may be varied to suit the requirements of a particular IC and the flow characteristics of the selected mold compound. The exact dimension of offset distance d1 for satisfactory encapsulation of a particular IC will be readily apparent to those skilled in the art given this disclosure. FIG. 8 illustrates, in accordance with one aspect of the present invention, an IC in which the height of offset segment d1 of bonding fingers 218 is less than the thickness of wafer board 204. FIG. 9 illustrates, in accordance with another aspect of the present invention, an IC in which the height of offset segment d1 of bonding fingers 218 is more than the thickness of wafer board 204.

Figure 10:
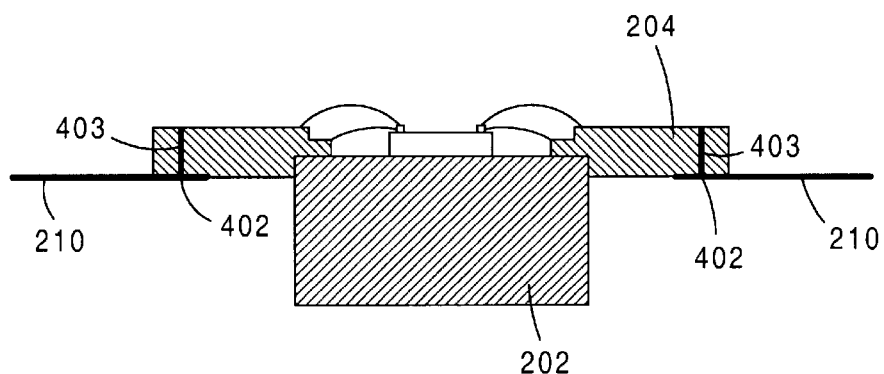
FIGS. 10, 11, and 12 show, in accordance with another embodiment of the present invention, an improved electrically and thermally enhanced (ETE) IC assembly that advantageously reduce pinhole formation and warpage.
Figure 11:
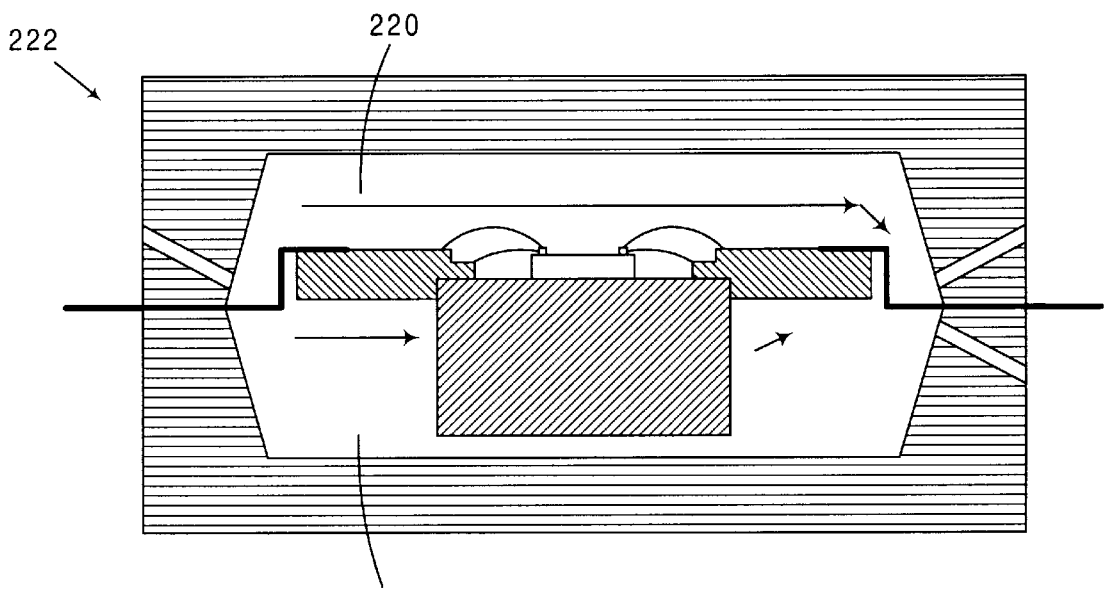

FIGS. 10 and 11 illustrate an alternative embodiment in which the inwardly-extending bonding fingers 402 of frame 210 are attached to the wafer board bonding pads disposed at the underside of wafer board 204, i.e., the side of wafer board 204 where there are no conducting leads. In contrast, the inwardly-extending fingers of the prior art ETE IC assemblies are attached to the upper surface of the wafer board where there are conducting leads. In the present invention, the bonding fingers 402 may then be electrically coupled to top-side conducting leads on wafer board 204 using a number of conventional techniques, including, for example, through the use of vias (shown as vias 403 in FIG. 10).

Figure 12:
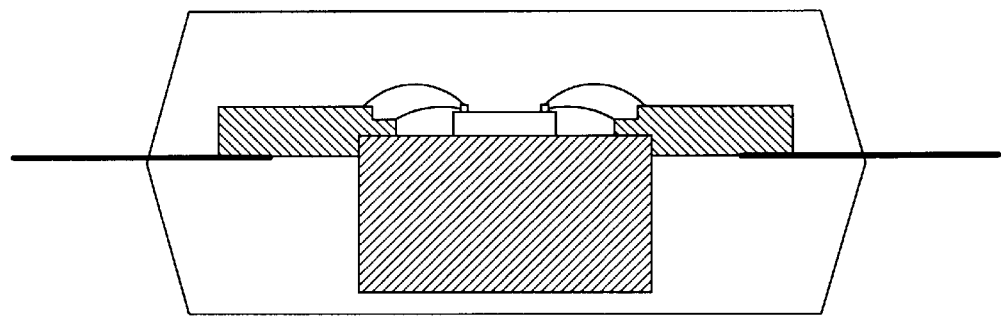

Since bonding fingers 402 attach to the underside of wafer board 204, more of wafer board 204 and thermally conductive heat sink 202 are elevated out of lower mold half 224 into upper mold half 220 when leadframe 210 is clamped between the two mold halves. In a manner analogous to that discussed in connection with FIGS. 5 and 6, the flow cross-section in upper mold half 220 is reduced, thereby improving the flow balance between the two mold halves. As mentioned earlier, this helps eliminate the formation of pinholes, or voids, in the finished IC. Again, the elevating feature balances the amount of mold material in the upper and lower halves of the finished IC to prevent pinhole formation and warpage without requiring additional bulk or flow-impeding structures. The finished IC without pinholes and having little, if any, warpage, is shown in FIG. 12.

Figure 13:
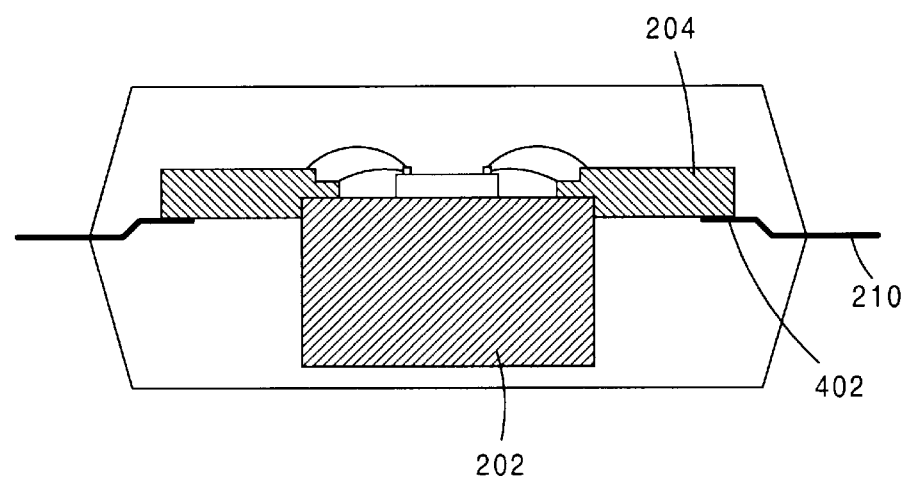
FIG. 13 shows an alternative embodiment of the improved electrically and thermally enhanced (ETE) IC assembly of FIG. 10.

It should be noted that the inwardly-extending ends of bonding fingers 402 of this embodiment may be but do not have to be co-planar with the plane defined by the mold-contacting edges of conducting leadframe 210. Depending on the requirements of a particular encapsulation process, e.g., the dimension of the IC components, the flow characteristics of the molten flow compound, and the like, the assembly comprising wafer board 204 and thermally conductive heat sink 202 may be elevated higher into (or lower out of) upper cavity half 220 by offsetting the ends of bonding fingers 402 upward (or downward). As an example, FIG. 13 shows a finished IC in which bonding fingers 402 are offset upward to further elevate the assembly comprising wafer board 204 and thermally conductive heat sink 202 into the upper cavity half of the mold and out of its lower cavity half.

Figure 14:
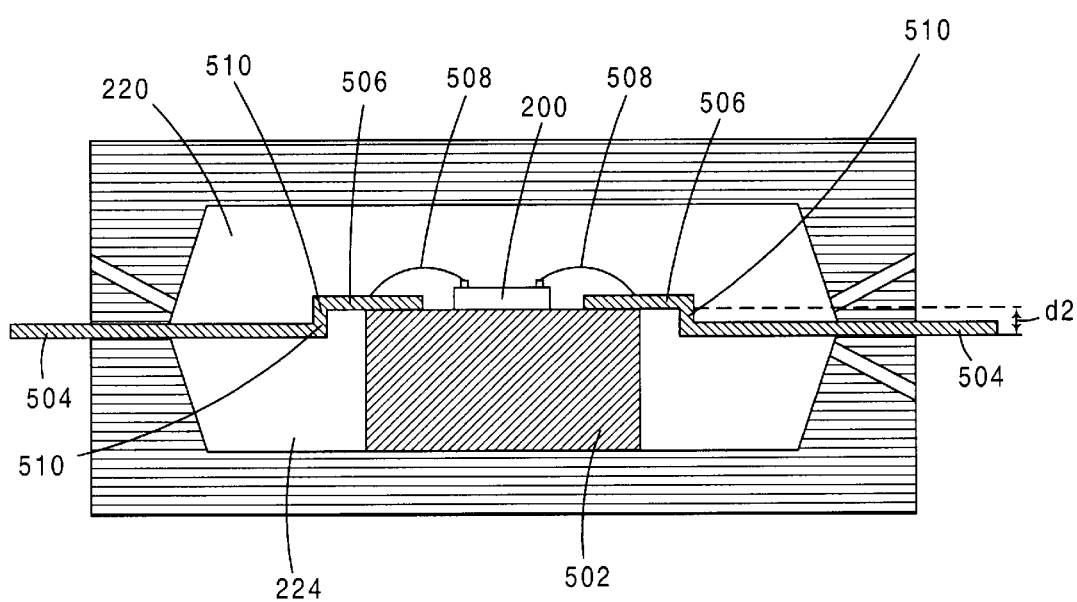
FIG. 14 shows, in accordance with yet another embodiment of the present invention, an improved thermally enhanced (TE) IC assembly that advantageously reduce pinhole formation and warpage.

The present inventive technique may also be applied to thermally enhanced (TE) IC's, i.e., those that employ heat sinks but not wafer boards, to render them more resistant to pinhole formation and warpage. For example, FIG. 14 illustrates, in one embodiment of the present invention, a thermally-enhanced (TE) IC assembly including an IC die 200, which is attached to a thermally conductive heat sink 502. A leadframe 504 having leadframe bonding fingers 506 electrically insulated from and physically attached to the outer periphery of heat sink 502 at its top surface is also shown. Conductive wires 508, typically formed of gold or other similarly suitable conductive materials, couple bonding fingers 506 to bonding pads on the upper surface of die 200 to provide conduction paths for signals, ground, Vdd, and the like, to and from die 200.

In accordance with one aspect of the present invention, the ends of bonding fingers 506 are offset, or bent, near heat sink 502 to define an elevated plane at its ends. As explained in connection with FIGS. 5 and 6, this creates an offset segment in the bonding fingers, shown as offset segment 510 in FIG. 14. This offset (indicated by offset distance d2 in FIG. 14) elevates both die 200 and thermally conductive heat sink 502 out of lower cavity half 224 and into upper cavity half 220 when the assembly is placed inside a mold, e.g., mold 24 of FIG. 1, for encapsulation and leadframe 210 is clamped between the two mold halves. The dimensions of both offset segment 510 and heat sink 502 may be adjusted to allow the lower surface of heat sink 502 to be exposed to the ambient environment after encapsulation while balancing the mold flow and mold mass in the two mold halves. In this manner, all the advantages discussed in connection with FIGS. 5 and 6 are realized, except that these advantages now also apply to thermally enhanced packages that do not employ wafer boards. Some of these advantages are: balanced mold flow in the mold cavity halves, reduced warpage, increased lead pull strength, reduced manufacturing complexity, and lower cost.

The resulting thermally enhanced (TE) or electrically and thermally enhanced (ETE) IC chip may then be incorporated in an electronic device, e.g., any of the of well known commercial or consumer electronic devices. The ability of the inventive technique to prevent pinhole formation and warpage without adding extra bulk or structures means that it is well suited for use in modem miniaturized and high speed electronic devices of which digital computers, consumer electronics, and industrial electronics are exemplary.

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for manufacturing an integrated circuit assembly, said integrated circuit assembly having a die, a thermally conductive heat sink coupled to a first side of said die, a multi-layer wafer board having wafer board bonding pads electrically coupling to die bonding pads on a second side of said die opposite said first side, said method comprising:

providing a conductive lead frame having a plurality of inwardly-extending fingers, said plurality of inwardly-extending fingers being offset from said conductive lead frame such that inward ends of said inwardly extending fingers form a first plane parallel to and separated from a second plane by an offset distance, said second plane representing a plane formed by said conductive lead frame; and electrically coupling said plurality of inwardly extending fingers with said wafer board bonding pads while positioning said multi-layer wafer board relative to said conductive lead frame such that when said integrated circuit assembly is placed in a mold having an exhaust vent for encapsulation with a mold compound and said conductive lead frame is clamped between a first cavity half and a second cavity half of said mold, a first portion of said multi-layer wafer board protrudes into said first cavity half of said mold while said thermally conductive heat sink at least partially protrudes into said second half of said mold, said first portion of said multi-layer wafer board, when said multi-layer wafer board is so positioned relative to said conductive lead frame, is of a size that impedes a flow of said mold compound in said first cavity half to a flow-balancing rate, said flow-balancing rate permits said said flow of said mold compound in said first cavity half and said second cavity half to arrive at said exhaust vent substantially simultaneously, thereby substantially reducing a likelihood of pinhole formation in said mold.

2. The method of claim 1 wherein said electrically coupling step further comprises the step of positioning said multi-layer wafer board such that at least a part of said first portion of said multi-layer wafer board is between said first plane and said second plane.

3. The method of claim 2 wherein said offset distance is selected such that when said multi-layer wafer board is positioned relative to said conductive lead frame by coupling said wafer board bonding pads to said plurality of inwardly-extending fingers, said flow of said mold compound in said first cavity half substantially fills said first cavity half before arriving at said exhaust vent and said flow of said mold compound in said second cavity half substantially fills said second cavity half before arriving at said exhaust vent substantially simultaneously with said flow of said mold compound in said first cavity half.

4. The method of claim 1 further comprising the steps of:

placing said integrated circuit assembly in said mold;

clamping said conductive lead frame between said first cavity half and said second cavity half; and injecting said mold compound into said mold to encapsulate said integrated circuit assembly.

5. A method for manufacturing an integrated circuit assembly, said integrated circuit assembly having a die, a thermally conductive heat sink having a first heat sink surface coupled to a first side of said die, said method comprising:

providing a conductive lead frame having a plurality of inwardly-extending fingers, said plurality of inwardly-extending fingers being offset from said lead frame such that inward ends of said inwardly extending fingers form a first plane parallel to and separated from a second plane by an offset distance, said second plane representing a plane formed by said conductive lead frame;

attaching an electrically insulated manner, said plurality of inwardly extending fingers to outer periphery of said thermally conductive heat sink at said first heat sink surface while positioning said thermally conductive heat sink relative to said conductive lead frame such that when said integrated circuit assembly is placed in a mold having an exhaust vent for encapsulation with a mold compound and said conductive lead frame is clamped between a first cavity half and a second cavity half of said mold, a first portion of said thermally conductive heat sink protrudes into said first cavity half of said mold while said thermally conductive heat sink at least partially protrudes into said second half of said mold, said first portion of said thermally conductive heat sink, when said thermally conductive heat sink is so positioned relative to said conductive lead frame for encapsulation, is of a size that impedes a flow of said mold compound in said first cavity half to a flow-balancing rate, said flow-balancing rate permits said said flow of said mold compound in said first cavity half and said second cavity half to arrive at said exhaust vent substantially simultaneously to avoid trapping air in said mold; and electrically coupling said plurality of inwardly extending fingers with bonding pads disposed on a second side of said die opposite said first side.

6. The method of claim 5 wherein said attaching step further comprises the step of positioning said thermally conductive heat sink such that at least a part of said first portion of said thermally conductive heat sink is between said first plane and said second plane.

7. The method of claim 6 wherein said offset distance is selected such that when said thermally conductive heat sink is positioned relative to said conductive lead frame by attaching said plurality of inwardly-extending fingers to outer periphery of said first heat sink surface, said flow of said mold compound in said first cavity half substantially fills said first cavity half before arriving at said exhaust vent and said flow of said mold compound in said second cavity half substantially fills said second cavity half before arriving at said exhaust vent substantially simultaneously with said flow of said mold compound in said first cavity half to avoid trapping air in said mold.

8. The method of claim 7 further comprising the steps of:

placing said integrated circuit assembly in said mold;

clamping said conductive lead frame between said first cavity half and said second cavity half; and injecting said mold compound into said mold to encapsulate said integrated circuit assembly.

* * * * *